United States Patent
Nielsen et al.

(10) Patent No.: US 6,963,189 B2
(45) Date of Patent: Nov. 8, 2005

(54) ATTENUATION CONTROL FOR DIGITAL POWER CONVERTERS

(75) Inventors: Karsten Nielsen, Helsingor (DK); Kennet Skov Andersen, Kobenhavn (DK)

(73) Assignee: Bang & Olufsen ICEPower A/S, Lyngby (DK)

( * ) Notice: Subject to any disclaimer, the term of this patent is extended or adjusted under 35 U.S.C. 154(b) by 0 days.

(21) Appl. No.: 10/498,565

(22) PCT Filed: Dec. 5, 2002

(86) PCT No.: PCT/IB02/05254
§ 371 (c)(1),
(2), (4) Date: Mar. 28, 2005

(87) PCT Pub. No.: WO03/055059
PCT Pub. Date: Jul. 3, 2003

(65) Prior Publication Data
US 2005/0168204 A1    Aug. 4, 2005

(30) Foreign Application Priority Data
Dec. 21, 2001    (SE)    .................................... 0104403

(51) Int. Cl.⁷ .............................................. G05F 1/40
(52) U.S. Cl. ..................................................... 323/283
(58) Field of Search .............................. 323/266, 268, 323/270, 271, 273, 282, 283, 284; 375/238, 375/254; 363/39, 40, 41

(56) References Cited

U.S. PATENT DOCUMENTS

| | | | |
|---|---|---|---|
| 5,049,841 A | * | 9/1991 | Cooper et al. ............ 333/81 R |
| 5,831,418 A | | 11/1998 | Kitagawa |
| 6,127,885 A | | 10/2000 | Colangelo |
| 6,137,429 A | * | 10/2000 | Chan et al. .................. 341/143 |
| 6,229,288 B1 | | 5/2001 | Baretich et al. |
| 6,556,631 B1 | * | 4/2003 | Yamamoto et al. ......... 375/340 |
| 6,594,309 B1 | * | 7/2003 | Grosso et al. .............. 375/238 |
| 6,700,518 B2 | * | 3/2004 | Kishida ..................... 341/143 |
| 2001/0014593 A1 | | 8/2001 | McCune |

* cited by examiner

Primary Examiner—Matthew V. Nguyen
(74) Attorney, Agent, or Firm—Harness, Dickey & Pierce, P.L.C.

(57) ABSTRACT

This invention relates to an attenuation control system (9) in a switching power conversion system comprising a digital modulator (4), for generating a modulated control signal from a (digital) source signal and a switching power state (6), said attenuation control system comprising: means for digitally attenuating the modulated signal, first gain shifting means (7) for shifting a supply voltage of said power stage between a plurality of predefined voltage levels, said first gain shifting means being arranged to decrease the power stage gain when the attenuation of the modulated signal exceeds a predefined level. This invention also relates to an attenuating method in a switching power conversion system comprising a digital modulator, for generating a modulated control signal from a (digital) source signal, and a switching power stage.

16 Claims, 5 Drawing Sheets

ATTENUATION CONTROL FOR DIGITAL POWER CONVERTERS

TECHNICAL FIELD

This invention relates to a switching power conversion system such as DC-AC, DC-DC or AC-AC conversion systems or any combination of the above mentioned. More specifically, the invention relates to attenuation control of a digital signal.

The invention may advantageously be used for improved power conversion in any digital input system, in particular high precision DC-AC power conversion systems such as high efficiency audio amplification.

TECHNICAL BACKGROUND

The attenuation control system (i.e. volume control in an audio amplification system) can be a central element of a digital power conversion system.

Most digital controlled power converters are based on a digital modulator that converts a pulse code modulated signals (PCM), received from a source such as a CD-player, to (E.G) pulse width modulated signals (digital PWM modulator). Alternatively the modulator is analog and is preceded by a D/A converter.

The output signal of the digital modulator is fed to a power stage where it is amplified. A typical power converter includes a switching power conversion stage, a filter and a control system.

The digital input of the modulator, i.e. the digital source, can be represented as any given bit frame length, giving a constant dynamic range. An attenuation in the digital domain, as shown in FIG. 1, will compromise the dynamic range of the attenuated digital signal, since the effective bit frame length will be reduced in order to reduce the signal amplitude. Attenuation in the power stage, on the other hand, will not compromise the digital dynamic range.

Noise and distortion contributions in a digital PMA (pulse modulated amplifier) can be caused by inaccuracy of the rising and trailing edges of the pulses in the power stage. An attenuation of the power stage output PWM signal amplitude will retain the dynamic range of the modulated signal, since the noise in the output pulse signals will be equally attenuated.

A general problem in a switching output power stage is the Electro Magnetic Compatibility (EMC), caused by the generally high amplitude of the power stage output PWM signal. In a conventional PMA, the modulation depth is lower at attenuated levels of the digital signal, so that the amplitude of the demodulated signal (i.e. the low pass filtered amplifier output) will be low compared to the amplitude of the power stage output PWM signal. A higher modulation depth combined with lower amplitude of the PWM signal can result in the same modulated signal, but would reduce the EMC problems.

The efficiency of a power stage generally declines when the modulation depth is lowered. This effect is a result of a decreasing ratio between the amplitude of the demodulated, low pass filtered output signal and the amplitude of the power stage output PWM signal. A higher modulation depth combined with lower amplitude of the PWM signal can retain the same modulated signal, but will increase the efficiency and dynamic range.

Therefore, it is desirable to effect attenuation in the power stage, as shown in FIG. 2. A digital amplifier system including attenuation control is described in U.S. Pat. No. 5,898,340. However, this system includes a complex power stage voltage supply, with an output voltage variable in a wide range. A system with a power supply that can change the output voltage continuously within a wide voltage range is very complex and thereby expensive. The mentioned system also includes A/D conversion means in the feedback path from the analog output. This will increase the complexity of the system further.

OBJECTS OF THE INVENTION

Accordingly, a primary object of the invention has been to provide an attenuation control technique in a digital controlled power conversion system that overcomes fundamental problems related to prior art techniques.

A further object is to retain the dynamic range of attenuated signals within a certain range.

Yet another object of the invention is to attenuate noise due to inaccuracy in the rising and trailing edges of the pulse waveforms in the PWM signal.

Still another object is to reduce the EMC problems at attenuated levels.

A further object of the invention is to increase the efficiency of said power conversion system at attenuated levels of the power stage PWM signal.

SUMMARY OF THE INVENTION

These objects are achieved by an attenuation control system of the kind mentioned by way of introduction, comprising means for digitally attenuating the demodulated output signal, first gain shifting means for shifting a supply voltage input of said power stage PWM output between a plurality of predefined voltage levels, said first gain shifting means being arranged to decrease the power stage gain when the attenuation of the digital signal exceeds a predefined level.

The attenuation control system can obtain a power stage step gain shift by shifting the supply voltage between predefined levels, thereby causing the amplitude of the output stage PWM signal to change. When these gain shifts occur, the digital modulator will shift the modulation depth of the PWM signal.

Between such steps in the supply voltage (gain shifts), the digital modulator will attenuate the modulator PCM and/or PWM signal. As the digital attenuation only is effected between the stepwise voltage shifts, the dynamic range for attenuated signal levels can be retained at a higher level compared to conventional systems, where the attenuation of the analog or digital-signal will imply a decreasing dynamic range.

The dynamic range can be retained at a high level through all attenuation levels since a large attenuation in the digital domain is not necessary due to the change in power stage amplification (power stage supply voltage). The amplitude of the PWM signal can be highly reduced at high attenuation levels.

For each gain shift the noise due to E.G inaccuracy of the rising and trailing edges of output signals will be reduced and efficiency improved.

The complexity of the power supply is low since the amplitude of the supply voltage only can obtain few values.

Also, the EMC problems are reduced when the PMA operates with a lowered supply voltage and the output power stage PWM signal amplitudes are reduced.

Further, the efficiency of the power stage is increased when the power stage supply voltage is lowered, since the energy consumed by the capacitive components in the power stage elements is reduced. Furthermore the ripple-currents are reduced contributing to lower AC-losses in the magnetic components.

Preferably, the attenuation control system includes second gain shifting means for shifting a gain in the feedback path, in accordance with the power stage gain shift. This second gain shifting means will cause a gain shift in the feedback path of the power stage control system, thereby compensating effects caused by different levels in the output power tage PWM signal. During a gain shift in the power stage, the demodulated amplifier output will not change amplitude.

The supply voltage input can be delivered by a power supply being capable of delivering a single step-variable voltage. Alternatively, the supply voltage input is delivered by a power supply being capable of delivering a plurality of predefined voltage. In that case, the power supply can be capable of retaining predefined voltages over a plurality of output charging capacitors. It can also comprise a plurality of power stages, each of which can be turned off when not needed.

Accordingly, a preferred embodiment, the digital modulator is a digital PCM(Pulse Code Modulation)-PWM(Pulse Width Modulation) modulator, producing a PWM control signal from a digital pulse code modulated input.

Alternatively, the digital modulator can comprise a D/A converter and an analog modulator, such as a self-oscillating modulator. Further, the means for digitally attenuating the modulated signal can be implemented in the modulator hardware.

The first and/or second gain shifting means can preferably but not necessarily be controlled by the digital modulator. This results in a compact and efficient system architecture.

According to another embodiment of the invention, the noise/distortion suppressing control system comprises means for delaying the modulated PWM signal and providing a delayed modulated PWM signal to the power stage noise/distortion suppressing control system. This improves the loop shaping of the noise/distortion suppressing control system.

Preferably, the power stage control system is a PEDEC (Pulse Edge Delay Error Correction) control system, and the second gain shifting means is arranged in a feedback path of this PEDEC control system. Thereby, the PEDEC control system does not compensate for the gain shift in the power stage.

According to an embodiment of the invention, a possible gain shift can for example correspond to a value of 8 times attenuation of the maximum output power.

According to a second aspect of the invention, the above objects are achieved by a method of for attenuation in a digital power converter of the previously mentioned type, comprising the steps of shifting the input supply voltage of said power stage between a plurality of predefined voltage-levels, and for each voltage level, digitally attenuating the modulated signal within a digital attenuation range, thereby achieving a total attenuation range greater than said digital attenuation range.

BRIEF DESCRIPTION OF THE DRAWINGS

Prior art systems and preferred embodiments of the present invention will be further described in the following, with reference to the appended drawings and simulation sheets.

DETAILED DESCRIPTION OF THE PREFERRED EMBODIMENTS

Figure 1:
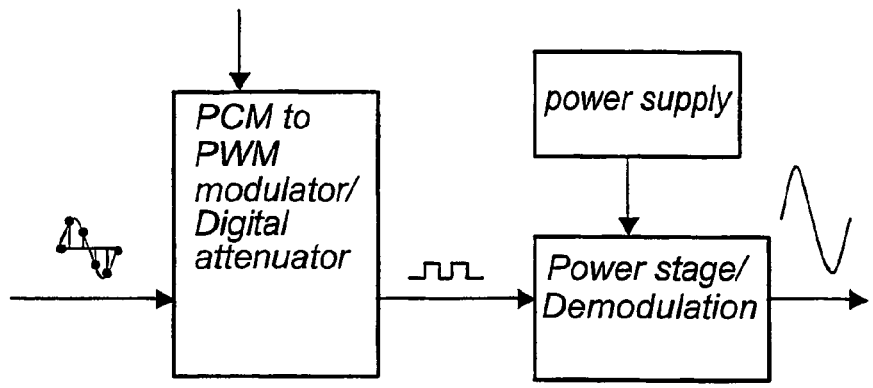
FIG. 1 illustrates a prior art digital attenuation system where the dynamic range is decreased when the modulated signal is attenuated.
Figure 2:
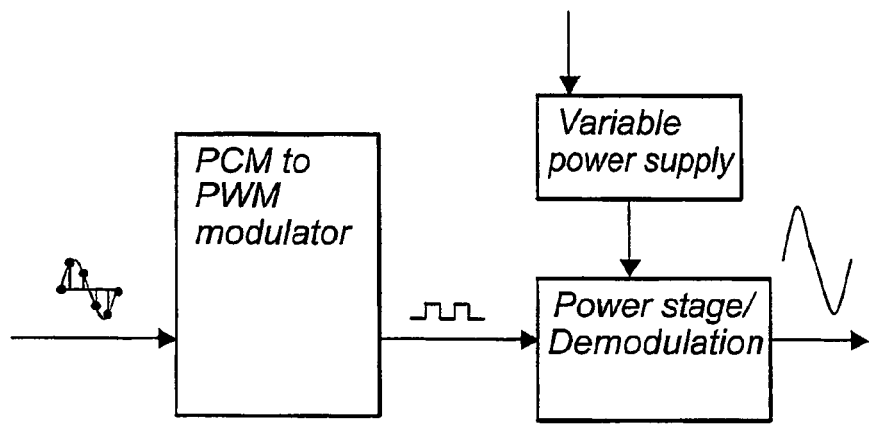
FIG. 2 illustrates a prior art system with continuously amplitude attenuation of the PWM signal.
Figure 3:
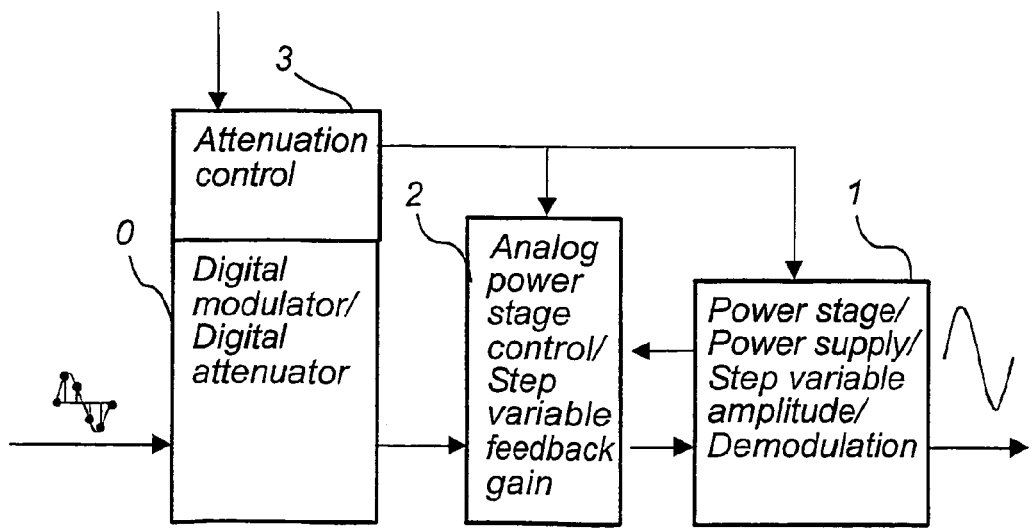
FIG. 3 illustrates a first embodiment of the invention as a general block diagram.

The first embodiment of the invention as a general block diagram is shown in FIG. 3, showing a digital modulator 0 and a power stage 1 with supply means that can shift output voltages, a control system 2 and attenuation control 3 in order to control the gain shifts.

The input to the digitally controlled power stage requires a digital signal, such as the signal from a CD-player or the like. The digital modulator 0 converts the digital PCM input signal to a PWM signal. The digital modulator 0 also receives an attenuation signal, e.g. from the volume knob of the amplifier. The modulator is arranged to serve as a digital attenuator, and is capable of making digital gain shifts, in way more closely described below.

The power stage control block 2 compensates for errors in the power stage 1 and has a step variable feedback gain. The feedback gain is changed at gain shifts. The power stage block 1 includes a switching power conversion stage a demodulation filter and a control system for obtaining a step-variable amplitude of the PWM signal. The attenuation control block 3 handles the general control of the digital attenuator, the gain shifts within the attenuator and gain shifts in the feedback path, in a way more closely described below.

Figure 4:
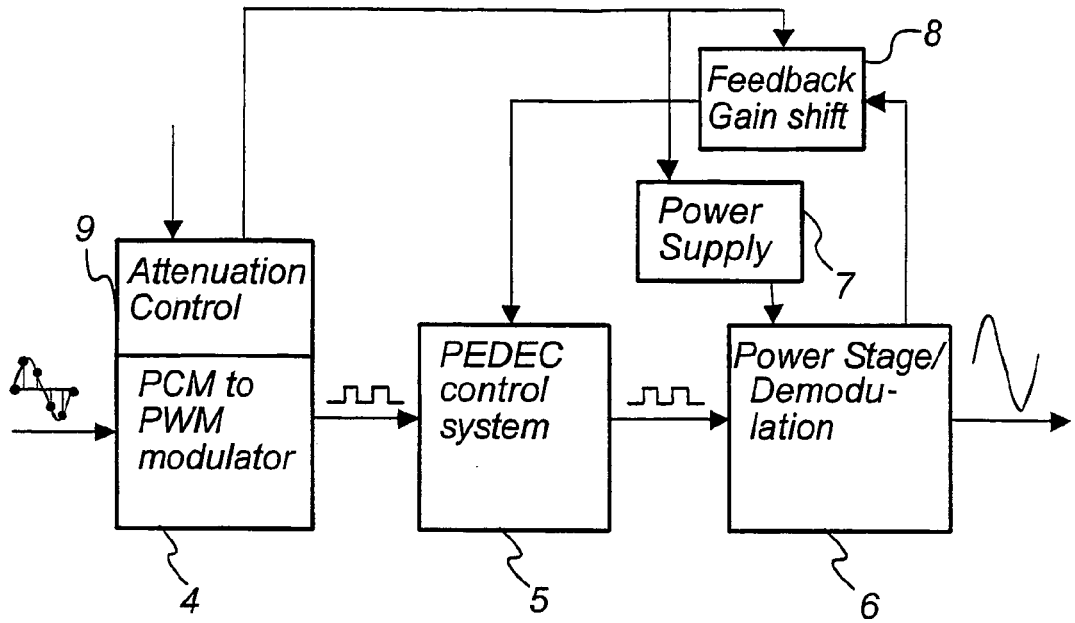
FIG. 4 illustrates a block diagram of a second embodiment of the invention.

A second preferred embodiment of the invention is shown in FIG. 4. The block diagram includes a digital PCM to PWM modulator 4 for converting the digital input signal to a pulse width modulated signal, a power stage 6, and a PEDEC (Pulse Edge Delay Error Correction) control system 5 for compensating errors in the power stage 6. PEDEC is described in the applicant's international patent application PCT/DK98/00133, hereby incorporated by reference.

This requires a gain shift 8 applied to the feedback to prevent the PEDEC control system 5 compensating for gain shifts in the power stage. The power stage 6 can be a single half-bridge or a plurality of half-bridges. The power supply 7 must be capable of shifting between a plurality of predefined supply voltages, obtaining different gain levels in the power stage. The power supply 7 can preferably comprise a single power stage. Another possible solution to the engineer skilled in the art is a power supply comprising a plurality of power stages that each can be turned off when not needed in order to increase efficiency.

The digital modulator 4 is capable of making digital attenuation by means of an attenuation control 9. The attenuation control 9 handles the general control of the digital attenuator 4 and controls the gain shifts in the power supply 7 and feedback 8.

Figure 5:
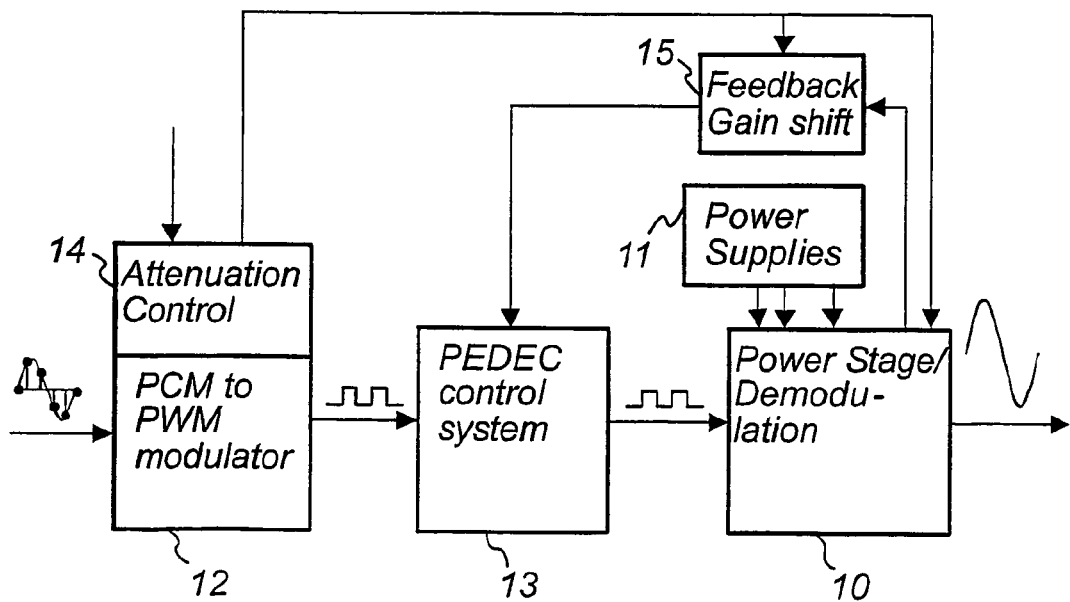
FIG. 5 illustrates a block diagram of a third embodiment of the invention.

A third preferred embodiment of the invention is shown in FIG. 5, comprising a digital PCM-PWM modulator 12, attenuation control 14, a power stage 10 connected to several power supply 11 voltage nodes, an internal switch between the supplies, including a PEDEC control system 13 and a gain switch in the feedback path 15.

Compared to the second preferred embodiment the power supply 11 does not shift between different voltages, instead it delivers multiple voltages for the attenuation control system 14 to choose from. The PMA power stage 10 makes the gain shift by shifting between these different power supply voltages.

Figure 6:
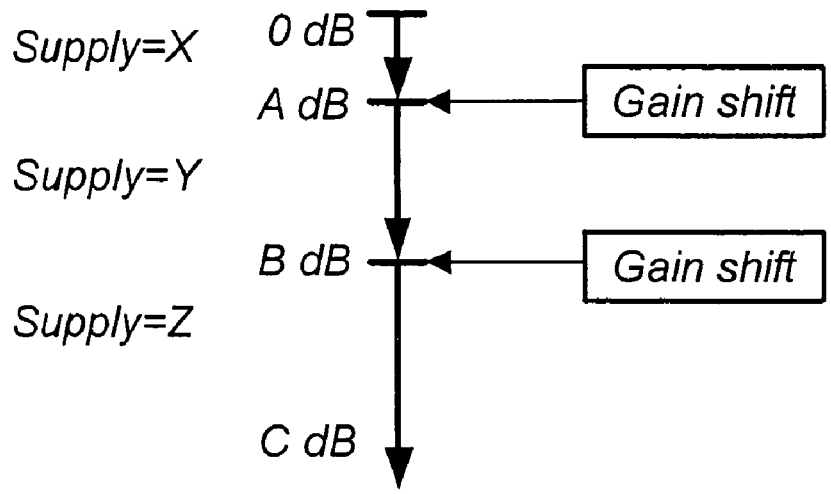
FIG. 6 illustrates an example of an attenuation scheme according to the invention in the range of 0 dB–C dB, with gain shifts at A dB and B dB.

FIG. 6 is a visual illustration of an attenuation scheme, possible to realize with the embodiments of the invention described above. The attenuation range can be chosen freely but in this example it comprises two gain shifts at attenuation level A dB and B dB. Attenuation down to A dB is achieved by digital attenuation. At A dB attenuation level the supply voltage to the power stage shifts from X to Y, corresponding to A dB attenuation, while the digital modulator shifts from A dB to 0 dB digital attenuation. Attenuation down to B dB is achieved by digital attenuation in the range 0 to B-A dB. At B dB attenuation level the supply voltage shifts from Y to corresponding to B dB attenuation, while the digital modulator shifts from B-A to 0 dB digital attenuation.

Attenuation down to C dB is achieved by digital attenuation in the range 0 to C-B dB.

Figure 7:
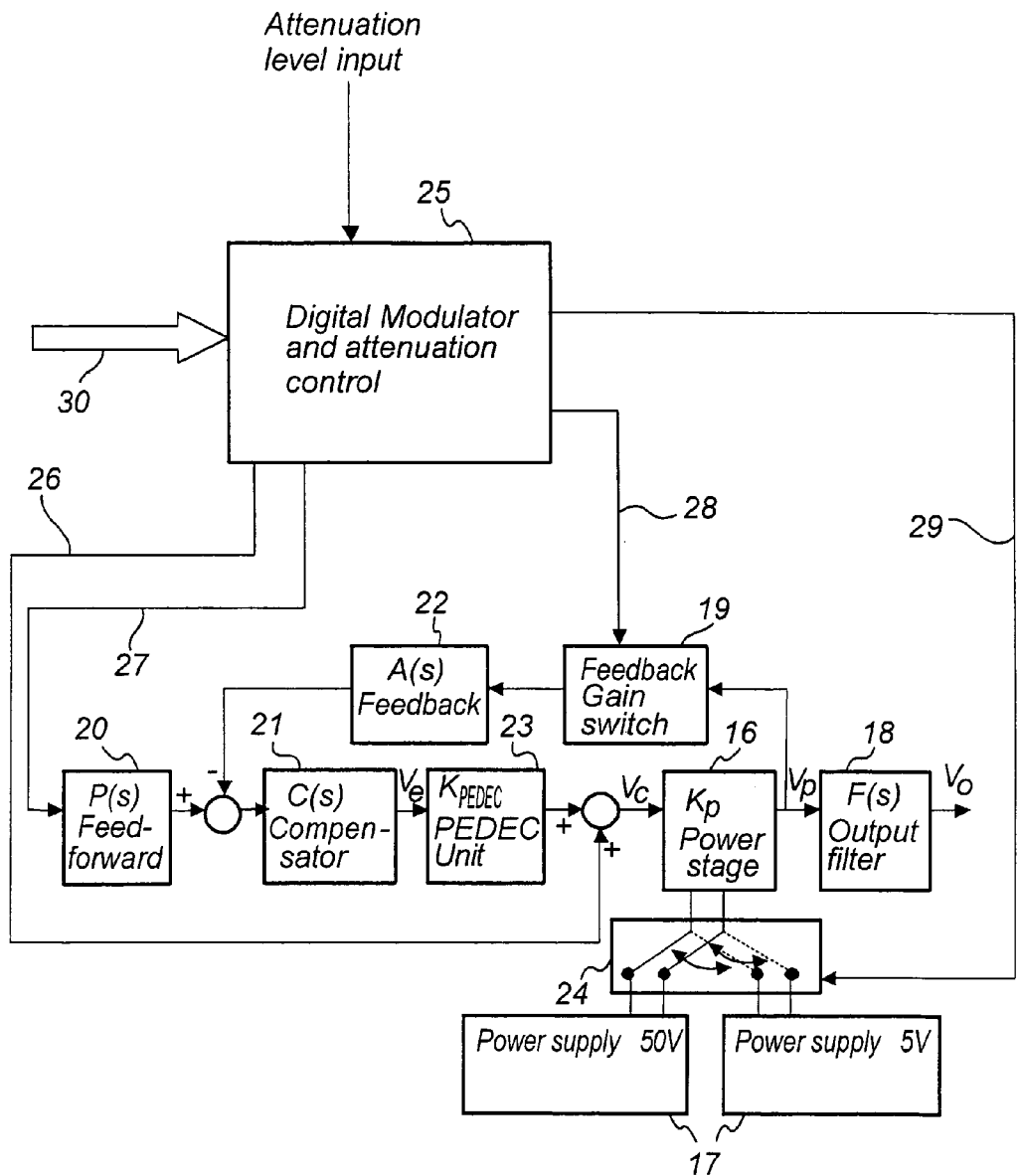
FIG. 7 illustrates a further preferred embodiment of the invention implemented as an attenuation control system.

FIG. 7 illustrates a complete attenuation control system, implemented on a PMA comprising a digital modulator 25, a power stage 16, an output filter 18, a VFC2 PEDEC control system 20,21,22,23, gain switches for the feedback gain 19, power supplies 17 and a gain switch 24 for switching between the different supply voltages.

The digital modulator 25 comprises an attenuation control system including generation of control signals 28, 29 for shifting the feedback gain 19 and for shifting between the power supplies 24. Furthermore the digital modulator 25 comprises a delay 27 of the PWM reference signal 26.

The input to the digital modulator is a digital PCM signal 30 that is modulated into two similar PWM signals, where one is delayed compared to the other. The delayed PWM signal 27 is made to improve loop shaping of said PEDEC control system 20,21,22,23. An appropriate delay will minimize the high frequency ripple on the correction signal $V_e$. The digital modulator 25 comprises means to switch between different power supply voltages 24 and a gain switch to control the feedback gain 19.

The modulator can be analog comprising a D/A converter in order to convert the PCM signal to analog signals. Furthermore the attenuation control can be implemented as an analog solution by switching the gain in an analog attenuation block instead of using a digital.

Figure 9:
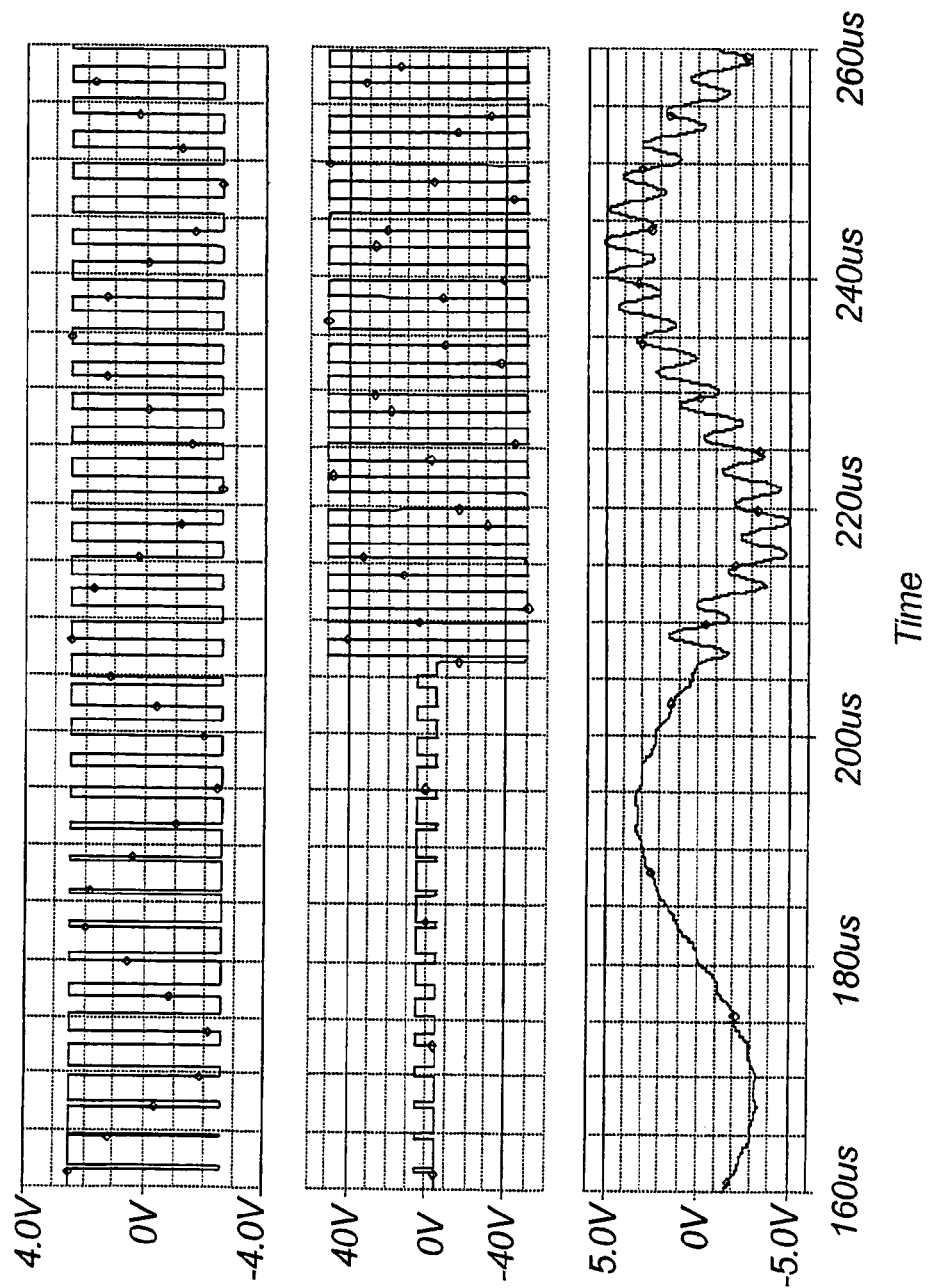
FIG. 9 illustrates a simulation of a 20 dB gain shift applied to the system in FIG. 7.

FIG. 9 shows a simulation of a gain shift example of 20 dB by the system illustrated in FIG. 7. The PWM signal just after the PCM to PWM modulator is shown at the top.

The modulated signal is a 20 kHz sinus. The modulation depth in the first part of the PWM signal is equal to a modulation index of M=0.8. After the gain shift the modulation index is 0.08.

Figure 8:
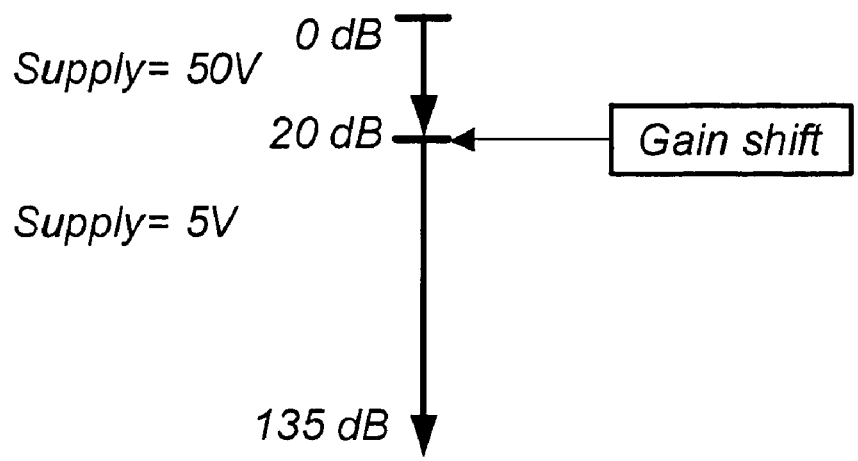
FIG. 8 illustrates an attenuation scheme implemented in the system in FIG. 7.

FIG. 8 shows the attenuation scheme. The 0 dB–20 dB attenuation level is made by the digital attenuator. At 20 dB attenuation a gain shift will occur and the digital attenuator will shift from 20 dB attenuation to 0 dB attenuation. The supply voltage to the PMA power stage will shift from 50V to 5V and the feedback gain will change +20 dB.

If the PWM signal from the digital modulator is a 9 bit 384 kHz signal the digital dynamic range is 115 dB. At 10 dB attenuation the dynamic range is 115 dB−10 dB=105 dB.

At 20 dB attenuation there is a gain shift that improves the dynamic range 20 dB and the dynamic range will be 115 dB+20 dB−20 dB=115 dB. At 30 dB attenuation the dynamic range is 115 dB+20 dB−30 dB=105 dB. The attenuation control system is therefore capable of obtaining an attenuation in the range of 0 dB–40 dB and have a minimum dynamic range of 95 dB. This will effectively, when listening to signals at attenuated levels below −20 dB correspond to an amplifier without change in the power supply, having a maximum dynamic range of 115 dB+20 dB=135 dB.

Furthermore the electromagnetic compatibility is increased at attenuated levels since the amplitude of the supply voltage is reduced. The supply voltage can preferably be lowered to a value corresponding to 8 times attenuation of the output power in order to overcome EMC demands.

Simulation 2 from the top of FIG. 9 shows the power stage output PWM signal, it is seen that there is a 10 times (20 dB) difference in the amplitude before and after the gain shift, also notice the difference in modulation depth before and after the gain shift. At the bottom of FIG. 9 the output signal of the amplifier is shown, the amplitude of the modulated signal is not changed at the gain shift except for the high frequency signal component. The high frequency signal component is attenuated 20 dB.

The attenuation control system can be implemented separately or in the modulator hardware that is preferably implemented in a DSP, a FPGA or on silicon substrates.

Furthermore the attenuation control system can be implemented in any given power conversion system such as AC-AC, DC-DC, DC-AC, AC-DC or any combination of the above mentioned, preferably DC-AC high precision audio power conversion systems, where the power stage elements operates in either "on" or "off" state.

What is claimed is:

1. An attenuation control system in a switching power conversion system comprising a digital modulator for generating a modulated control signal from a (digital) source signal, and a switching power stage, said attenuation control system comprising:

means for digitally attenuating the modulated signal, first gain shifting means for shifting a supply voltage of said power stage between a plurality of predefined voltage levels, said first gain shifting means being arranged to decrease the power stage gain when the attenuation of the modulated signal exceeds a predefined level.

2. An attenuation control system according to claim 1, wherein the switching power conversion system further comprises a power stage control system for suppressing noise and distortion in the power stage, including a feedback path from said power stage, second gain shifting means for shifting a gain in the feedback path, in accordance with the power stage gain shift.

3. An attenuation control system according to claim 1, wherein said supply voltage is delivered by a power supply being capable of delivering a single step-variable voltage.

4. An attenuation control system according to claim 1, wherein said supply voltage is delivered by a power supply being capable of delivering a plurality of predefined voltages.

5. An attenuation control system according to claim 4, wherein said power supply is capable of retaining predefined voltages over a plurality of output charging capacitors.

6. An attenuation control system according to claim 5, wherein said power supply further comprises a plurality of power stages, each of which can be turned off when not needed.

7. An attenuation control system according to claim 1, where the digital modulator is a digital PCM(Pulse Code Modulation)-PWM(Pulse Width Modulation) modulator, producing a PWM control signal from a digital pulse code modulated input.

8. An attenuation control system according to claim 1, wherein the digital modulator comprises a D/A converter and an analog modulator, preferably a self-oscillating modulator.

9. An attenuation control system according to claim 1, wherein said means for digitally attenuating the modulated signal is implemented in the modulator hardware.

10. An attenuation control system according to claim 1, wherein said first and/or second gain shifting means is/are controlled by said digital modulator.

11. An attenuation control system according to claim 1, further comprising means for delaying said modulator PWM signal and providing a delayed modulator PWM signal to said control system.

12. An attenuation control system according to claim 2, wherein said power stage control system is a PEDEC control systems, and said second gain shifting means is arranged in a feedback path of said PEDEC control system.

13. An attenuation control system according to claim 1, wherein a possible gain shift corresponds to a value of eight times attenuation of the maximum output power.

14. An attenuation control system according to claim 1, implemented on silicon substrates.

15. An attenuation control system according to claim 1, implemented in a general power conversion system in particular DC-AC power conversion systems such as Class D amplifiers or any Pulse modulated amplifier where the power stage elements operates in either "on" or "off" state.

16. Method for attenuating a switching power conversion system having a digital modulator for generating a modulated control signal from a (digital) source signal, and a switching power stage, said method comprising the steps of:

shifting the gain of said power stage between a plurality of predefined levels, and for each level, digitally attenuating the modulated signal within a digital attenuation range, thereby achieving a total attenuation range greater than said digital attenuation range.

* * * * *